(12) United States Patent
Oda et al.

(10) Patent No.: US 9,773,642 B2
(45) Date of Patent: Sep. 26, 2017

(54) ELECTRON BEAM MELTING FURNACE AND METHOD FOR OPERATING SAME

(71) Applicant: TOHO TITANIUM CO., LTD., Chigasaki-shi, Kanagawa (JP)

(72) Inventors: Takashi Oda, Chigasaki (JP); Hisamune Tanaka, Chigasaki (JP); Takeshi Shiraki, Chigasaki (JP)

(73) Assignee: TOHO TITANIUM CO., LTD., Chigasaki-Shi, Kanagawa (JP)

( * ) Notice: Subject to any disclaimer, the term of this patent is extended or adjusted under 35 U.S.C. 154(b) by 669 days.

(21) Appl. No.: 14/355,847

(22) PCT Filed: Jun. 12, 2013

(86) PCT No.: PCT/JP2013/066263
§ 371 (c)(1),
(2) Date: May 2, 2014

(87) PCT Pub. No.: WO2014/017206
PCT Pub. Date: Jan. 30, 2014

(65) Prior Publication Data
US 2014/0294035 A1 Oct. 2, 2014

(30) Foreign Application Priority Data
Jul. 24, 2012 (JP) ................................ 2012-163550

(51) Int. Cl.
*H01J 37/305* (2006.01)
*H01J 37/304* (2006.01)
(Continued)

(52) U.S. Cl.
CPC ............ *H01J 37/304* (2013.01); *B22D 23/06* (2013.01); *C22B 9/228* (2013.01); *C22C 14/00* (2013.01);
(Continued)

(58) Field of Classification Search
CPC ...... H01J 37/304; H01J 37/305; H01J 37/222; H01J 37/3045; H01J 37/22; B22D 23/06;
(Continued)

(56) References Cited

U.S. PATENT DOCUMENTS 5,273,102 A * 12/1993 Lillquist ................ B22D 23/06
164/452
2007/0045913 A1 3/2007 Fiore et al.

FOREIGN PATENT DOCUMENTS

JP 6-3727 A 4/1987
JP 62-248558 A 10/1987
(Continued)

*Primary Examiner* — Hung D Nguyen
(74) *Attorney, Agent, or Firm* — Fitch, Even, Tabin & Flannery, LLP

(57) ABSTRACT

An electron beam melting furnace includes a hearth, a mold, an electron gun for keeping metal as a molten state, an electron beam controller for controlling direction of the electron beam, an image sensor for molten metal, and an operating device. A method for operating the furnace includes a step of inputting electron beam emitting coordinates in the electron beam controller, a step of emitting the electron beam, a step of detecting a high electron beam intensity spot by the image sensor, a step of calculating coordinates of high electron beam intensity based on the detected signal by the operating device, a step of calculating differences between the coordinates of emission and the coordinates of high electron beam intensity spot, a step of inputting the difference in the electron beam controller, and a step of controlling the location of electron beam spot.

3 Claims, 3 Drawing Sheets

(51) Int. Cl.

| | |
|---|---|
| *F27D 11/08* | (2006.01) |
| *C22B 9/22* | (2006.01) |
| *B22D 23/06* | (2006.01) |
| *H01J 37/22* | (2006.01) |
| *F27D 11/12* | (2006.01) |
| *F27D 19/00* | (2006.01) |
| *C22C 14/00* | (2006.01) |

(52) U.S. Cl.
 CPC .............. *F27D 11/08* (2013.01); *F27D 11/12* (2013.01); *F27D 19/00* (2013.01); *H01J 37/22* (2013.01); *H01J 37/222* (2013.01); *H01J 37/305* (2013.01); *H01J 37/3045* (2013.01); *F27D 2019/0071* (2013.01)

(58) Field of Classification Search
 CPC .......... C22B 9/228; F27D 11/08; F27D 11/12; F27D 19/00; F27D 2019/0071; C22C 14/00
 USPC ............ 373/10, 12, 16, 17, 13, 14; 164/452, 164/469, 494, 495, 470, 506, 508
 See application file for complete search history.

(56) References Cited

FOREIGN PATENT DOCUMENTS

| JP | 4-124229 A | 4/1992 |
|---|---|---|
| JP | 5-192747 A | 8/1993 |
| JP | 9-143718 A | 6/1997 |
| JP | 2007-64618 | 3/2007 |

\* cited by examiner

ELECTRON BEAM MELTING FURNACE AND METHOD FOR OPERATING SAME

TECHNICAL FIELD

The present invention relates to a technique in which an electron beam is emitted on a molten metal pool formed in a mold or a hearth arranged in an electron beam melting furnace, and in particular, relates to a technique in which location of heating by the emission of electron beam is controlled.

BACKGROUND ART

It is well known that effects of purification of raw material are greater and much purer metal can be appropriately produced in an electron beam melting furnace since the degree of pressure reduction can be set lower compared to that in a vacuum arc melting furnace.

Among electron beam melting furnaces, there are many cases in which a furnace for purification, called a hearth, is arranged therein. By melting raw material in the hearth, impurities contained in the raw material can be effectively removed, thereby enabling purification of the raw material.

In an electron beam melting furnace, a target is heated and melted by emitting an electron beam emitted from an electron gun arranged on the ceiling part of the melting furnace. Since an electron beam that is emitted from an electron gun has a property of traveling straight, by bending the electron beam by a deflection coil and by setting intensity of the electron beam, the target can be reliably heated and melted.

However, inside the hearth in the electron beam melting furnace, the target is held while being melted by heating with an electron beam, and metal is also vaporized from the target location. In a case in which the vapor enters into the electron beam route, the electron beam and the metallic vapor interfere with each other, and as a result, there may be a case in which the direction of the electron beam is changed, and the electron beam cannot be emitted in the required direction that is set. Furthermore, in addition to this situation inside of the electron beam melting furnace, there may be a case in which direction of the electron beam is changed to an undesirable direction by noise that entered from the outside. Furthermore, it is well known that the electron beam and the deflection coil to bend the electron beam are easily influenced by an external magnetic field, and in that case, there may be a case in which the electron beam is bent to an undesirable direction, and thus, improvements for these problems has been required.

In the case in which the electron beam is spread in an unintended direction as described above, for example, the wall of the hearth in which molten metal is held may be heated, and in a case in which this heating is not considered for a long time, the hearth may be undesirably damaged.

To solve such problems, a technique is known, in which temperature distribution of a part heated by an electron beam is measured and intensity of the electron beam is adjusted based on the measured value (See Patent Document 1). However, there is no disclosure regarding correction of unintended displacement of location of the electron beam spot.

Furthermore, a means is known, in which erroneous emission of an electron beam is detected by detecting characteristic X rays that are generated in a case in which the electron beam emitted from an electron gun erroneously emits a mold (See Patent Document 2).

However, in this method, since erroneous operation can be detected after the erroneous emission of an electron beam, the mold cannot be prevented from being damaged, and the hearth may be undesirably significantly damaged.

As mentioned above, a technique is desired, in which an electron beam emitted from an electron gun can be prevented from being undesirably displaced and the electron beam can be reliably emitted to a target to be heated.

The Patent Documents are follows:
Patent Document 1: Japanese Unexamined Patent Application Publication No. Hei 05 (1993)-192747
Patent Document 2: Japanese Examined Patent Application Publication No. Hei 06 (1994)-003727

An object of the invention is to provide a technique in which an electron beam is emitted accurately to a pre-set location of a molten metal pool formed in a hearth or a mold arranged in an electron beam melting furnace.

The inventors have researched in view of the above circumstances, and they have found that a region to be heated of a molten pool formed in a hearth or a mold can be accurately controlled as follows: two pieces of information are compared; one piece of information is a location information of high electron beam intensity spot of molten pool in the hearth or the mold arranged in the electron beam melting furnace to which an electron beam is certainly emitted that is output by an image sensor, and the other piece of information is a location information of a region to be emitted from an electron beam gun that is preliminarily recorded in a controlling means of the electron beam, and a location of the electron beam spot is controlled so that the difference between the two pieces of information becomes minimal. Thus, the present invention has been completed.

SUMMARY OF THE INVENTION

That is, the electron beam melting furnace of the present invention includes: a hearth and a mold for holding molten metal, an electron gun for emitting an electron beam for keeping the metal as a molten state, an electron beam scanning pattern generation device for controlling a signal of the location of an electron beam spot from the electron gun, and an electron beam controlling means for controlling direction of the electron beam according to the control signal input therein, and the electron beam melting furnace further includes: an image sensor for detecting a high electron beam intensity spot formed by an electron beam on the surface of molten metal in the hearth or the mold, an operating device for calculating a location difference between actual location of the high electron beam intensity spot detected by the image sensor and the pre-set location emitted from the electron beam gun that is set at the beginning of the melting process, an emitting device for generating a signal for correcting the above difference calculated by the operating device, and a device for adding the correction signal to the control signal.

It is desirable that the image sensor be a CCD camera with high resolution or a temperature sensor in the electron beam melting furnace according to the present invention.

The method for operating an electron beam melting furnace of the present invention is to operate the following electron beam melting furnace, the electron beam melting furnace includes: a hearth and a mold for holding molten metal, an electron gun for emitting an electron beam for keeping the molten metal in a melted condition, an electron beam scanning pattern generation device for controlling a signal of a location of the electron beam spot from the electron gun, and an electron beam controlling means for controlling direction of the electron beam according to the control signal input therein, and the electron beam melting furnace further includes: an image sensor for detecting a high electron beam intensity spot formed by emitting an electron beam at the surface of molten metal in the hearth or the mold, an operating device for calculating a location difference between actual location of the high electron beam intensity spot detected by the image sensor and the pre-set location to be emitted from the electron beam gun that is set at the beginning of the melting process, an emitting device for generating a signal for correcting the above difference calculated by the operating device, and a device for adding the correction signal to the control signal, and the method includes a step of controlling a location of an electron beam spot so that the location difference of the actual location of the high electron beam intensity spot detected by the image sensor and the pre-set location of the electron beam gun set at the beginning of the melting process be not more than a pre-set value.

It is desirable that the location of electron beam spot be controlled so that a difference between coordinates to be emitted and coordinates of the high electron beam intensity spot is minimal in the method for operating the electron beam melting furnace according to the present invention.

It is desirable that above location difference are controlled to be not more than 1 mm in case that the coordinates of the high electron beam intensity spot are defined as (x, y) and the pre-set coordinate to be emitted are defined as (X, Y), an absolute value of a difference in the X coordinates in plane coordinates thereof |X−x| and an absolute value of a difference in Y coordinates in plane coordinates thereof |Y−y|, in the method for operating the electron beam melting furnace according to the present invention.

It is desirable that the location difference presented by $\{(Y-y)^2+(X-x)^2\}^{1/2}$ is controlled to be not more than 1 mm displacement in case of the high electron beam intensity spot coordinates (x, y) and the pre-set coordinate to be emitted (X, Y), in the method for operating the electron beam melting furnace according to the present invention.

It is desirable that a metal to be melted is titanium or titanium alloy in the method for operating the electron beam melting furnace according to the present invention.

According to the above-mentioned present invention, a molten metal pool that is formed in the hearth and the mold arranged in the electron beam melting furnace can be accurately heated without damaging the hearth and the mold, and as a result, the entirety of the hearth can be effectively used.

Figure 1:
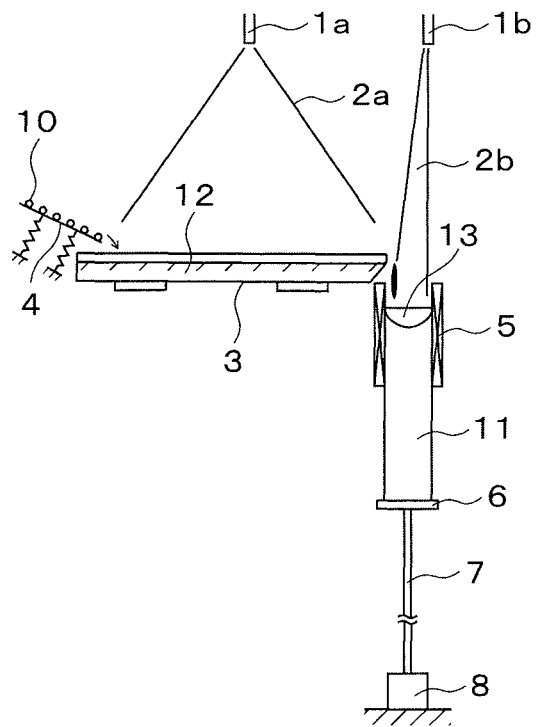
FIG. 1 is a cross sectional view showing conceptually the electron beam melting furnace of the present invention.

EXPLANATION OF REFERENCE NUMERALS 1a, 1b: Electron gun, 2a, 2b: Electron beam, 3: Hearth, 4: Raw material feeder, 5: Water cooled copper mold, 6: Extracting base, 7: Shaft, 8: Driving force for extracting, 10: Raw material, 11: Ingot, 12: Molten metal pool, 13: Molten metal pool, 20: Image sensor, 30 to 34: Region of emission programmed, 30a to 34a: Edge part (start point of emission), 30b to 34b: Edge part (end point of emission), 30c: Location of emission programmed, 30d: Location of emission displaced.

Best Mode for Carrying Out the Invention

The best Embodiments of the present invention are explained with reference to the drawings.

Before the explanation of desirable Embodiment of the present invention, a desirable Embodiment of the electron beam melting furnace used in the present invention is explained with reference to FIG. 1. FIG. 1 is a conceptual diagram of an electron beam melting furnace. Reference numeral 4 is a raw material feeder for supplying raw material 10 from the outside. A hearth 3 for holding the raw material 10 and molten metal 12 thereof is arranged at the downstream of the raw material feeder 4. A mold 5 for cooling and solidifying the molten metal 12 that is poured therein is arranged at the downstream of the hearth 3. An electron gun 1a for melting the raw material to form the molten metal 12 in the hearth 3 and an electron gun 1b for maintaining molten metal pool 13 in the mold 5 are arranged at an upper part of the hearth 3 and the mold 5. At a lower part of the mold 5, an extracting base 6 for engaging an ingot 11 that is formed by cooling and solidifying the molten metal 12 is connected, and a shaft 7 and an extracting driving force 8 for extracting the extracting base 6 together with the ingot 11, are connected.

First, the raw material 10 such as titanium sponge is put into the hearth molten metal 12 that is formed inside of the hearth 3, from a side wall of the hearth 3. The raw material 10 that is put into the hearth molten metal 12 is emitted by electron beam 2a from the electron gun 1a, so as to mix with the hearth molten metal 12, and the molten metal 12 is supplied to the mold 5 that is arranged at the downstream of the hearth 3.

The hearth molten metal 12 that is supplied to the mold 5 forms the molten metal pool 13 while maintaining the melted condition by the electron beam 2b emitted from the electron gun 1b at the vicinity of surface, and the solidified shell is formed more by cooling and is progressively solidified by cooling by a water-cooled wall of the mold 5. The solidified shell that is formed on the vicinity of wall of the inside of the mold 5 becomes thicker toward the bottom in the mold 5 along the extracting direction, and finally, the entirety of the diameter becomes a solid phase and it is extracted as the ingot 11.

The extracting base 6 is engaged to the bottom part of the ingot 11, and the ingot can be extracted in the vertically lower direction by the extracting driving force 8 via the shaft 7 connected to the extracting base 6.

Figure 2:
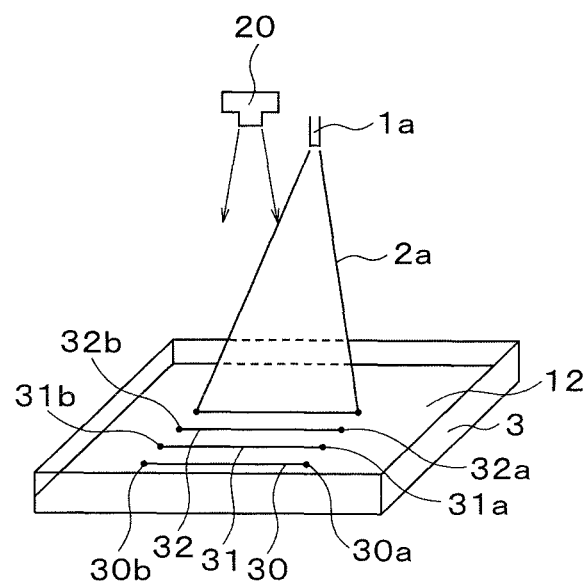
FIG. 2 is an oblique view showing conceptually a situation of emission of electron beam in the present invention.

FIG. 2 shows enlarged parts of the electron gun 1a, the water-cooled copper hearth 3, and the hearth pool 12 held therein while being in a fused condition, in FIG. 1. In the present invention, furthermore, an image sensor 20 is arranged at the vicinity of the electron gun 1a. By this image sensor 20, a location at which an electron beam is emitted on the hearth pool 12 can be detected, as explained below.

The electron beam 2a is controlled so that it is emitted from the electron gun 1a while scanning linearly the surface of the hearth pool 12. That is, XY coordinates per unit time from the beginning of emission between start points 30a to 32a and end points 30b to 32b that are preliminarily programmed and inputted, are outputted from an electron beam scanning pattern generation device (not shown) as a control signal, this control signal is input in an electron beam controlling means (not shown), magnetic field of a deflection coil of the electron gun is controlled in X direction and Y direction by the electron beam controlling means in which the control signal is imputed, the electron gun emits the beam from the start point 30a to the end point 30b in region 30, the electron gun emits the beam from the start point 31a to the end point 31b in region 31, and the electron gun emits the beam from the start point 32a to the end point 32b in region 32, and similarly, the electron gun emits to a pre-set region in order at high speed.

In a case in which the location to which the electron beam 2a is emitted is observed from an observation window that is arranged at a main body of the electron beam melting furnace, although the electron beam itself is invisible, there may be a portion from which high intensity is generated by emission of the electron beam on the hearth pool 12, and thus the region to which the electron beam is actually emitted can be understood by the high intensity part as an indicator. As shown in FIG. 2, the above-mentioned high electron beam intensity spots are observed in a linear shape (as shown as 30 to 32) to the vicinity of interface of a region to which the electron beam is emitted and a region to which the electron beam is not emitted, and in particular, they can be observed particularly at higher intensity at the edge points 30a/b, 31a/b, and 32a/b which are respectively the start points and the end points of emission of the electron beam.

Therefore, by detecting heat that is generated from these high electron beam intensity spots having relatively higher temperature than the circumference thereof by using the image sensor 20, the XY coordinates of the high electron beam intensity spot can be read. In this way, it becomes possible to set the location to be emitted with the electron beam, to emit the electron beam, and to detect the actual location at which the electron beam is emitted. It should be noted that a CCD camera having higher resolution is desirable as the image sensor 20; however, another image sensor can be used as long as light from the high electron beam intensity spot can be detected.

In the controlling method of an electron beam melting furnace of the present invention, first, by performing input operation of the coordinates of location of electron beam spot per unit time manually, location of emission on the molten metal 12 held in the hearth 13, that is, the plane coordinates, is preliminarily recorded in the electron beam scanning pattern generation device (not shown) and is output as the control signal. Here, the "coordinates per a unit time" means each coordinate to which an electron beam should be emitted after the passing of a pre-set time from the beginning of emission.

Next, after recording the region of emission of electron beam, the control signal is input in the electron beam controlling means and the means is operated, an electron beam is emitted while scanning within the region as mentioned above, and the molten metal 12 held in the hearth 3 can be heated evenly.

In the present invention, the image sensor 20 is arranged in the vicinity of the electron gun 1a arranged at an upper space of the hearth 3. The coordinates for high electron beam intensity spots are obtained based on temperature information of a part actually melted by the image sensor 20. By the operating means (not shown), differences between a preliminarily programmed coordinates to which an electron beam should be emitted at the time and the coordinates of high electron beam intensity spot are calculated, and the region to which the electron beam 2a is actually emitted can be understood.

In a case in which the location difference between the actual location of the high electron beam intensity spot (heated region) obtained based on the above-mentioned temperature information and the location information preliminarily stored in the electron beam controlling means is more than an upper limit, the location of an electron beam spot can be corrected.

Figure 3:
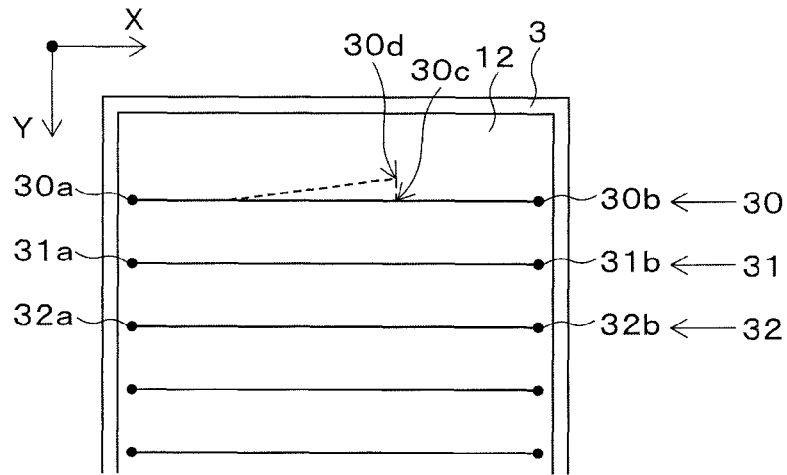
FIG. 3 is a plan view showing a situation of emission of an electron beam to the hearth in the present invention.
Figure 4:
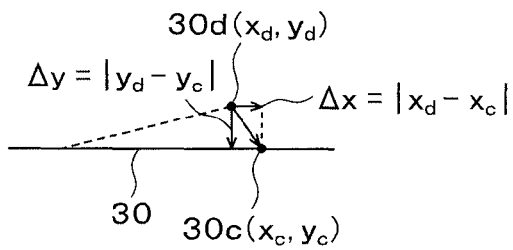
FIG. 4 is a plan view showing a magnified part in which an electron beam is displaced in FIG. 3.

The method is practically explained with reference to FIGS. 3 and 4. Parts drawn by solid lines in FIGS. 3 and 4 are regions of target of emission of an electron beam that is preliminarily programmed. Emission of the electron beam is started from the start point 30a, and in a case in which the electron beam begins to be displaced by interference of metallic vapor or an influence of an external magnetic field and the electron beam is emitted along a course shown by a dashed line, the image sensor may detect the high intensity location at 30d (coordinates $x_d$, $y_d$) whereas the electron beam should be emitted at 30c (coordinates $x_c$, $y_c$) based on the preliminarily programmed coordinate information, at a certain time. Thus, there may be differences between the two coordinates.

These two coordinates are input in the operating means, and amount of displacement, that is, $\{(y_d-y_c)^2+(x_d-x_c)^2\}^{1/2}$ is calculated. In a case in which the amount of displacement is more than a pre-set value, information of an X component of displacement $\Delta X=|x_d-x_c|$ and Y component of displacement $\Delta Y=|y_d-y_c|$ are fed back to the electron beam controlling means, and direction of the electron beam is corrected at these X components and Y components so as to solve difference between coordinates 30d and 30c.

Figure 6:
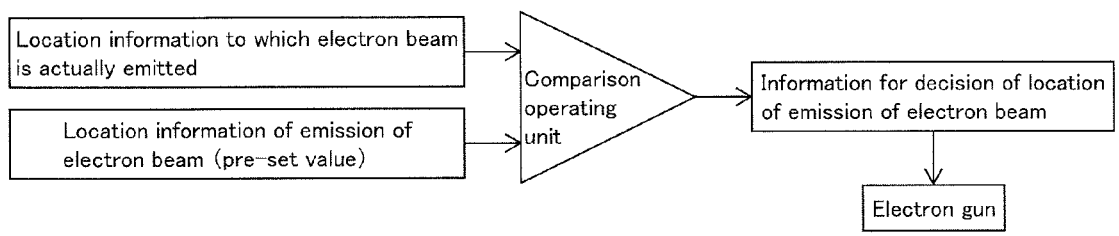
FIG. 6 is a flowchart diagram showing control of location of an electron beam spot in the present invention.

As shown in FIG. 6, correction of emission location of an electron beam can be performed as follows: the two pieces of location information are input in a comparison operating unit; a signal for controlling emission location of electron beam so as to correct for difference between them, that is, difference between the two coordinates, is output therefrom; the signal is input in the electron gun controlling device; and the location of electron beam spot is automatically controlled.

Figure 7:
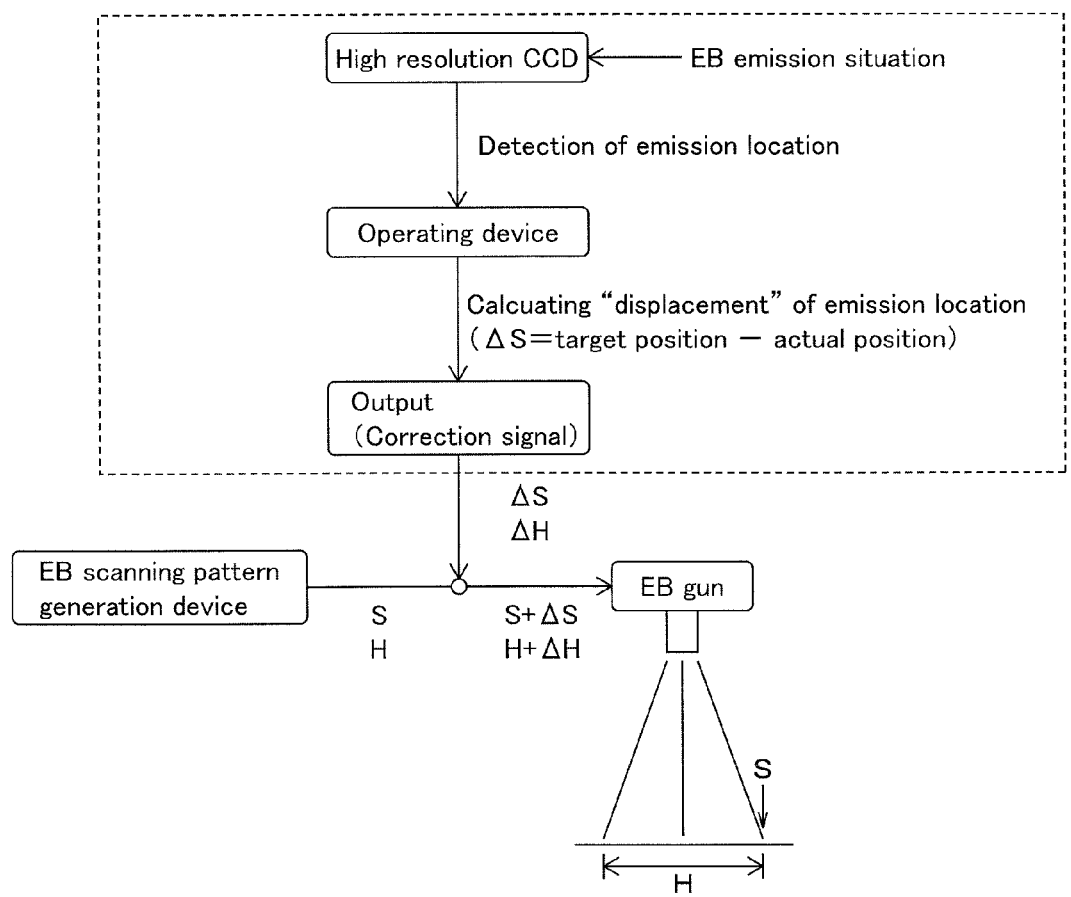
FIG. 7 is a flowchart diagram showing control of location of an electron beam spot in the present invention.

FIG. 7 shows a system of controlling an electron beam, which is a practical content of FIG. 6. The high resolution CCD shown in FIG. 7 is one desirable embodiment of an image sensor according to the present invention, and it is desirable that based on a result of photographing the emission circumstances of the electron gun, the device be constructed so that a high electron beam intensity spot heated in the hearth or mold pool by emission of electron beam can be detected.

According to the high electron beam intensity spot detected by the above-mentioned device, location of the electron beam spot can be detected. The information of location of emission is input in the operating device, based on displacement from calculated value between the target location emission of electron beam and the actual location, signal for correction is generated, this signal is added to a signal that is input to the electron gun from the electron beam scanning pattern generation device, and the actual location of emission can be closer to the target location of emission of the electron beam.

The "H" shown in FIG. 7 means a width of the electron beam that is emitted onto a surface of pool formed in the hearth or the mold. The width H of the electron beam can be output as a width (H) of signal of emission of electron beam.

It should be noted that the high resolution CCD camera, operating device and emitting device of the correction signal that are surrounded by dashed lines in FIG. 7 can be constructed as an individual unit and can be added to a conventional electron beam scanning pattern generation device, to perform the present invention.

Alternatively, the present invention can be also performed by building the high resolution CCD camera, operating device and emitting device of correction signal into the electron beam scanning pattern generation device.

In FIGS. 3 and 4, it is desirable that the absolute value of the difference of plane coordinates ($x_d$, $y_d$) of the location heated by the electron beam and the plane coordinates ($x_c$, $y_c$) of the location of target of the electron beam be controlled so as to be not more than a pre-set value.

In the present invention, in particular, it is desirable that the absolute value of difference of the plane coordinates thereof be controlled so as to be 1 mm or less.

That is, formulating this under the situation of FIG. 4, it can be expressed as the formulas (1) and (2).

$$|x_d - x_c| < 1 \text{ mm} \quad (1)$$

$$|y_d - y_c| < 1 \text{ mm} \quad (2)$$

By controlling electric current applied in the deflection coil equipped in the electron gun $1a$, the location of electron beam spot $2a$ can be controlled by a varying magnetic field formed in the coil. Defining a direction of an electron beam from the electron gun in a case in which there is no input in the deflection coil as a initial location, direction of electron beam can be varied from the initial location to a direction along X axis direction by applying current on a deflection coil of an X direction, and similarly, direction of an electron beam can be varied from the initial location in a direction along the Y axis direction by applying a current (separately from the X coil) on a deflection coil of the Y direction.

In the present invention, by operating on the plane coordinates ($x_c$, $y_c$), the plane coordinates ($x_d$, $y_d$) and the formulas (1) and (2) in the operating means, and by feeding the results back to the electron gun $1a$, a region to be actually heated can be accurately controlled in the hearth pool 12.

Figure 5:
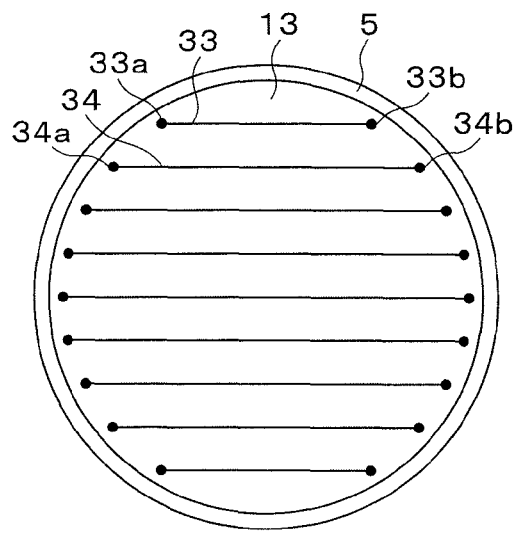
FIG. 5 is a plan view showing a situation of emission of an electron beam to the mold in the present invention.

The present invention can be desirably employed at the molten metal pool 13 formed in the mold 5 in addition to the hearth 3. The situation is shown in FIG. 5. As shown in FIG. 5, as a region to which an electron beam should be emitted in the mold 5, coordinates of a region 33 from start point $33a$ to end point $33b$ are programmed, and coordinates of a region 34 are also similarly programmed, so as to perform emission of the electron beam, detection of high electron beam intensity spot, and correction of location of emission in a manner similar to that mentioned above.

In addition, the electron beam melting of the present invention can be appropriately applied to melting of titanium alloy in addition to melting of pure titanium. Furthermore, it can also be appropriately applied to a metal having high melting point such as molybdenum, niobium or the like in addition to pure titanium or titanium alloy.

EXAMPLES

The present invention is further exemplified in detail by way of Examples and Comparative Examples.
1) Output of electron gun: 400 kA
2) Hearth
　Material: Water cooled copper
　Dimensions: Length 0.5 m×width 0.3 m
3) Mold
　Material: Water cooled copper
　Shape of mold cross section: Circular shape
4) Raw material for melting: Sponge titanium, alloy scrap
5) Image sensor: High resolution CCD camera 6) Operating device: A device in which location information of a high electron beam intensity spot is operated based on temperature information detected by the CCD camera, and then it is compared with the location to emit the electron beam, and a signal for correction of location of emission of the electron beam is output.
7) Electron beam emission location controlling device: A device in which emission direction of the electron beam is controlled by a deflection coil, and furthermore, emission direction of the electron beam is controlled based on the correction signal output from the operating device.

Example 1

Using the above mentioned devices, titanium sponge was supplied to the hearth and melted to form molten metal, and this molten metal was poured into the mold to produce an ingot. After production of the ingot, as a result of observation of the hearth wall arranged in the electron beam melting furnace by the human eye, there was no damaged part found in the hearth.

Comparative Example 1

An ingot was produced by emitting an electron beam using an initial program and in a manner similar to that in Example 1, except that the image sensor and the electron beam emission location controlling device of the present invention were not used and therefore emission location of the electron beam was not corrected. After production of the ingot, as a result of dismantling the electron beam melting furnace and observation of damaged situation of the hearth by human eye, there was observed one point having slight damage formed by emission of the electron beam.

Example 2

An ingot was produced in a manner similar to that in the Example 1, except that alloy scrap was used as the raw material instead of sponge titanium. As a result of analyzing distribution of alloy component in the ingot produced, it was confirmed that variation was within 3% to 8% in relative error relative to the absolute value of the average value of the ingot, in each of the longitudinal direction and the radial direction.

Comparative Example 2

An alloy ingot was produce in a condition similar to that in Comparative Example 1, except that the raw material of Example 2 was used. As a result of analyzing the segregation situation of alloy components along the longitudinal direction and the radial direction in the alloy ingot produced, it was confirmed that variation was 6% to 17% in relative error relative to absolute value of the average value.

The present invention can provide longer service life of a hearth or a mold used in an electron beam melting furnace, and furthermore, can provide an apparatus and a method to produce ingots having uniform composition.

The invention claimed is:
1. A method for operating an electron beam melting furnace, the electron beam melting furnace comprising:
　a hearth and a mold for holding molten metal,
　an electron gun for emitting an electron beam for keeping the metal as a molten state, an electron beam scanning pattern generation device for controlling a control signal of a location of the electron beam from the electron gun, an electron beam controlling means for controlling direction of the electron beam according to the control signal input therein, an image sensor for detecting a high electron beam intensity spot formed by the electron beam on the surface of the molten metal in the hearth or the mold, an operating device for calculating a location difference between an actual location of the high electron beam intensity spot detected by the image sensor and a pre-set location to be emitted from the electron beam gun that is set at the beginning of the melting process, an emitting device for generating a correction signal for correcting the location difference calculated by the operating device, and a device for adding the correction signal to the control signal, and the method comprising a step of controlling a location of the electron beam spot so that the location difference between an actual location of the high electron beam intensity spot detected by the image sensor and a pre-set location to be emitted from the electron beam gun set at the beginning of melting process is not more than a pre-set value, wherein the location difference is controlled to be not more than 1 mm in case that the coordinates of the high electron beam intensity spot are defined as (x, y) and the pre-set coordinates to be emitted are defined as (X, Y), an absolute value of a difference in the X coordinates in plane coordinates thereof is |X−x| and an absolute value of a difference in Y coordinates in plane coordinates thereof is |Y−y|.

2. A method for operating an electron beam melting furnace, the electron beam melting furnace comprising:

a hearth and a mold for holding molten metal, an electron gun for emitting an electron beam for keeping the metal as a molten state, an electron beam scanning pattern generation device for controlling a control signal of a location of the electron beam from the electron gun, an electron beam controlling means for controlling direction of the electron beam according to the control signal input therein, an image sensor for detecting a high electron beam intensity spot formed by the electron beam on the surface of the molten metal in the hearth or the mold, an operating device for calculating a location difference between an actual location of the high electron beam intensity spot detected by the image sensor and a pre-set location to be emitted from the electron beam gun that is set at the beginning of the melting process, an emitting device for generating a correction signal for correcting the location difference calculated by the operating device, and a device for adding the correction signal to the control signal, and the method comprising a step of controlling a location of the electron beam spot so that the location difference between an actual location of the high electron beam intensity spot detected by the image sensor and a pre-set location to be emitted from the electron beam gun set at the beginning of melting process is not more than a pre-set value, wherein the location difference presented by $\{(Y-y)^2 + (X-x)^2\}^{1/2}$ is controlled to be not more than 1 mm displacement in case of the high electron beam intensity spot coordinates are (x, y) and the pre-set coordinates to be emitted are (X, Y).

3. A method for operating an electron beam melting furnace, the electron beam melting furnace comprising:

a hearth and a mold for holding molten metal, an electron gun for emitting an electron beam, a pattern generator for providing a control signal of a location of the electron beam, an electron beam controller for directing movement of the electron beam according to the control signal, an image sensor for detecting an electron beam spot formed by the electron beam on the surface of the molten metal in the hearth or the mold, an operating device for calculating a location difference between an actual location of the electron beam spot detected by the image sensor and a pre-set location to be emitted from the electron beam gun, an emitting device for generating a correction signal for correcting the location difference calculated by the operating device, and a device for adding the correction signal to the control signal, and the method comprising:

a step of controlling a location of the electron beam spot so that the location difference is the absolute value of the difference of plane coordinates $(x_d, y_d)$ of a location heated by the electron beam and plane coordinates $(x_c, y_c)$ of a target location.

* * * * *